United States Patent [19]

Barkalow et al.

[11] Patent Number: 4,879,970
[45] Date of Patent: Nov. 14, 1989

[54] COATING HOOD FOR APPLYING COATING COMPOUND ON CONTAINERS

[75] Inventors: Raymond W. Barkalow, Jackson; Harold S. Dick, Watchung, both of N.J.; Roger T. Guthrie, Spartanburg, S.C.

[73] Assignee: M&T Chemicals Inc., Woodbridge, N.J.

[21] Appl. No.: 41,024

[22] Filed: Apr. 21, 1987

[51] Int. Cl.⁴ .............................................. C23C 16/00
[52] U.S. Cl. .................................... 118/719; 118/314; 118/326; 118/722; 118/729; 427/424
[58] Field of Search ............... 118/314, 326, 719, 722, 118/729; 427/424

[56] References Cited

U.S. PATENT DOCUMENTS 3,516,811 6/1980 Gatchet et al. .
3,684,469 8/1972 Goetzer et al. .
3,819,404 6/1974 Scholes et al. .
4,389,234 6/1983 Lindner et al. .

Primary Examiner—Bernard Pianalto
Attorney, Agent, or Firm—S. A. Marcus

[57] ABSTRACT

A coating hood for applying uniform protective coatings to glass containers, while minimizing the escape of noxious fumes from the hood to the ambient atmosphere, which includes a pair of spaced side walls having inclined end surfaces adjacent the entrance and exit ends to reduce the amount of stagnant ambient air thereat; coating air supply slots in the side walls for supplying process air to the containers; and finish air supply slots positioned at a height above the coating air supply slots for supplying coating free air.

6 Claims, 13 Drawing Sheets

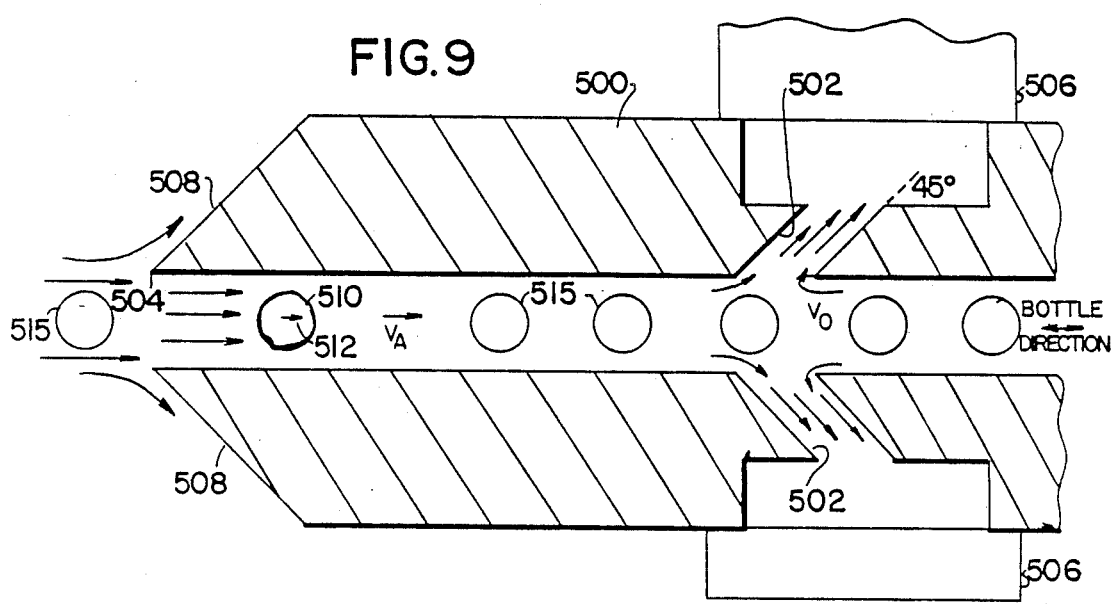

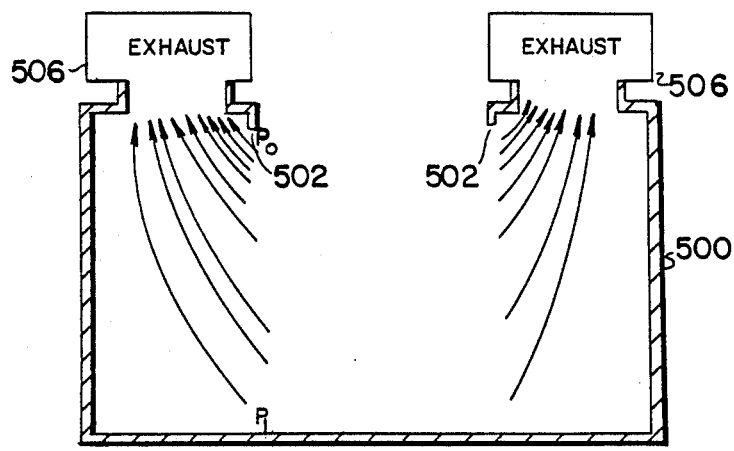
FIG. 14
FIG. 15
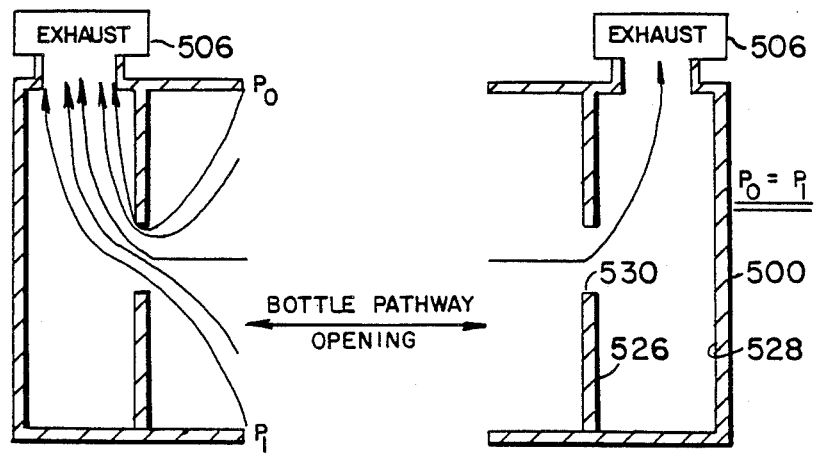

FIG. 17
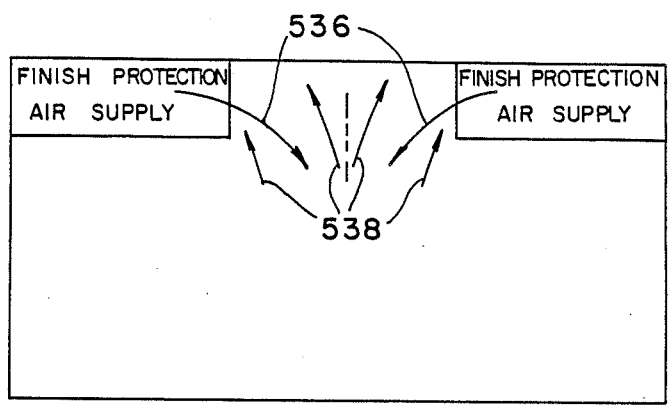
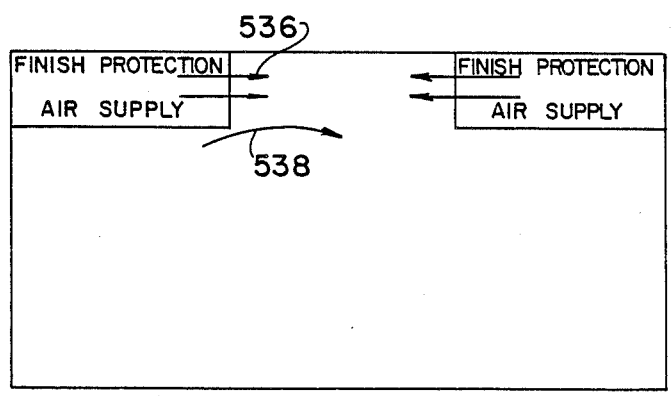
FIG. 18

COATING HOOD FOR APPLYING COATING COMPOUND ON CONTAINERS

BACKGROUND OF INVENTION

The instant invention relates generally to a coating hood for applying a protective coating to hollow glass containers.

The desirability of applying protective coatings to the exterior of hollow glass containers has long been recognized. Such coatings, which include tin, titanium, or metallic compounds, other heat decomposable or organometallic compounds, protect the glass containers from surface damage, such as abrasions and scratches, which result in a loss of tensile strength for the glass containers. The need for high-tensile strength in glass containers is particularly acute when containers are mass-produced, move rapidly in close proximity along high-speed conveyor lines and are subsequently filled with carbonated beverages, beer, wine, foodstuffs, and the like that produce gaseous pressure within the container.

Such protective coatings are usually applied as the glass containers emerge in a heated, fully-shaped condition from a glassware forming machine, that is, at the "hot end" of the system. The containers are transported away from the forming machine by a conveyor. Temperatures in excess of 400 degrees Centigrade exist at the surface of the glass containers, so that when a heat decomposable inorganic metallic, or organometallic, compound is applied thereto, the compound decomposes immediately and is converted to a metallic oxide coating.

One well-known and previously widely used technique for applying a protective coating to the ht glass containers calls for spraying the opposite sides of the containers as they travel on a conveyor, in single file, through two longitudinally spaced, oppositely positioned spray heads. Each spray head covers approximately 180 degrees of the circumference of the bottle, so that at least two spraying stations are required to coat the entire bottle. Receivers are positioned at the opposite side of the conveyor in alignment with the spray head. Pressurized air with the coating compound entrained therein is discharged from each spray head at a significant pressure, while the receivers are usually maintained at a low pressure. The net pressure differential increases the velocity, and thus the effectiveness, of the coating compound. Coating systems of this nature are disclosed in U.S. Pat. No. 3,516,811, granted June 23, 1980, to G. L. Gatchet et al., and U.S. Pat. No. 3,684,469, granted Aug. 14, 1972 to W. C. Goetzer et al.

Gatchet et al. recognized that the deposition of a metallic oxide coating on the finish of the glass container passing on a conveyor through the open-sided coating apparatus was undesirable, as noted in column 3, lines 21–57. To control the location of the metal oxide deposit, as well as the uniformity of the deposit, Gatchet et al. relied upon spray heads producing a (theoretically) laminar flow that would pass laterally across the width of the conveyor, as shown in FIG. 4 of the patent.

The above-described coating systems, however, are "open-sided" and are thus adversely influenced by ambient conditions in the factory where the glass containers are formed. The ambient conditions of prime concern are rapidly moving air currents, the moisture in the air, and the potentially toxic and/or corrosive fumes and pollutants issuing from the spray heads. Air currents can cause turbulent conditions at the spray heads that will cause a preferential or uneven, application of the protective coating, and some of the coating will accumulate on the bottle finish. The rapidly moving air currents disrupt the laminar flow patterns that are theoretically possible with "open-sided" systems, and the capability of uniformly, and consistently, applying the same thickness of coating is severely reduced. To compensate for air currents, the above-described systems are operated at higher pressures, and with greater throughput of coating compound, than would be required under quiescent conditions. The moisture in this hostile atmosphere causes hydrolysis loss by rendering some of the compound unfit for its intended purpose. Further, the escape of potentially toxic fumes into the atmosphere at the work place constitutes an occupational health hazard that may violate Federal, state and local ordinances. Also, the toxic fumes are highly corrosive and attack various components of the glass factory, such as the blowers, exhaust systems, conveyors, and even roofs, leading to increased plant maintenance costs. Furthermore, the efficiency of these "open-sided" systems is low, since much of the relatively expensive coating compound is wasted.

A second, well-known, and widely employed technique for applying a protective coating to hot glass containers relies upon a formed, sheet metal coating hood with spray heads and associated receivers situated therein. The coating hood obviates many of the problems associated with the open-ended spray systems discussed above. For example, the hood isolates the glass containers to be coated from the ambient conditions and furnishes a controlled atmosphere that enhances the coating operations. The hood includes an exhaust system which captures most the air entrained coating compound that does not adhere to the containers, thus reducing the problems of venting the system and minimizing the opportunity for the coating compound to attack building components. Also, such hood can significantly raise the coating efficiency of the systems, with attendant cost savings.

Representative coating hoods are disclosed in U.S. Pat. No. 3,819,404, granted June 25, 1974 to Addison B. Scholes and Joseph J. Kazlowski, in U.S. Pat. No. 3,933,457, granted Jan. 20, 1976 to Addison B. Scholes, in U.S. Pat. No. 4,389,324, granted June 21, 1983 to Georg H. Lindner and U.S. patent Ser. No. 684,046, to Georg H. Lindner et al. The most recent patent to Lindner et al. presents a coating hood including a tunnel for allowing containers to pass therethrough, and a vertically adjustable flat roof for accommodating containers of various sizes. At least two jet slots are located in each side wall, and at least two receivers or suction slots are aligned therewith. The jet slots and suction slots are interspersed opposite to each other in each side wall. The coating compound is introduced through at least one feedpoint, and blowers secured to the side wall furnish high velocity air containing the coating compound to the interior of the hood. Baffles are situated in the flow path of the high velocity air so that the jets issuing from the jet slots are well defined and thus better suited for their intended function.

In a unique fashion in the Lindner coating hood, two or more recirculating loops are defined by the judicious selection of blowers, jet slots and receivers. The coating compound is fed into the innermost loop, and the eddy currents created between loops by the closely spaced, oppositely directed jets transfer the coating compound to the intermediate loop and thence the outermost loop. The outer loop will have the lowest coating compound concentration and, consequently, less compound is lost to the exhaust system. The employment of recirculating loops within the coating hood has led to more uniform coatings and greater consistency in the coating operation over extended periods of time.

Another known coating hood is shown in U.S. Reissue Pat. No. 28,076, granted July 16, 1974 to B. O. Augustsson and R. S. Southwick.

Although the foregoing coating hoods perform satisfactory under most operating conditions; they may be vulnerable, however, to the effect of fumes escaping the hood.

The most obvious way of reducing the possibility of fume release from a coating hood is to increase the amount of exhaust from the hood, this has the side effect of extracting a higher percentage of circulating air from the outer air loop, thereby decreasing the efficiency of the coating process. Therefore, it is desirable to find a way of preventing fumes from entering the ambient air, while simultaneously limiting the amount of internal exhaust that is used.

Another cause of fumes escaping to the atmosphere, which must be considered, is external air currents near the hood that can enter the hood and affect flow conditions within the hood. Therefore, it is also desirable to reduce these external air currents, or at least their entrance into the hood.

Still another cause of escaping fumes results from stagnant air that is trapped between bottles as they exit the hood.

Lastly, due to the high temperatures involved with the process air, the exhaust system will have a handle a larger quantity of air than the amount of calculated ambient air intake and finish protection air.

Thus, all of these factors must be taken into consideration when constructing a coating hood to minimize escape of fumes therefrom.

OBJECTS AND SUMMARY OF THE INVENTION

Accordingly, it is an object of the present invention to provide a coating hood that minimizes the escape of fumes from the coating hood without unduly extracting coating vapors from the hood.

It is another object of the present invention to provide a coating hood that minimizes he effect of external air currents on flow conditions within the hood.

It is still another object of the present invention to provide a coating hood that minimizes stagnant air trapped between bottles passing through the hood.

It is yet another object of the present invention to provide a coating hood that dilutes and minimizes the boundary layer air film around each bottle passing through the hood.

It is a further object of the present invention to provide a coating hood that has a more uniform velocity profile in the vertical direction of the exhaust slots.

It is a yet further object of the present invention to provide improved exhaust of fumes from the coating hood.

In accordance with one embodiment of the present invention, a coating hood for applying uniform protective coatings to glass containers, includes (a) a pair of spaced side walls defining a space through which the containers pass from an entrance opening to an exit opening; (b) coating air supply means defined in at least one side wall for supplying process air comprised of a coating material entrained in a gas, to the containers; (c) exhaust means defined in at least one side wall for receiving an output from the space; (d) means for introducing a coating compound to the coating air supply means; and (e) means for reducing the amount of the output that escapes through the entrance and exit openings.

In accordance with another embodiment of the present invention, a coating hood for applying uniform protective coatings to glass containers, includes (a) a pair of spaced side walls defining a space through which the containers pass from an entrance opening to an exit opening; (b) coating air supply means defined in at least one side wall for supplying process air comprised of a coating compound entrained in a gas, to the containers; (c) exhaust means defined in at least one side wall for receiving an output from the space, the exhaust means including at least one exhaust slot in at least one of the side walls, each exhaust slot being inclined at an angle away from a respective closest one of the entrance and exit openings to reduce the amount of the output that escapes through the entrance and exit openings; and (d) means for introducing a coating compound to the coating air supply means.

In accordance with still another aspect of the present invention, a coating hood for applying uniform protective coatings to glass containers, includes (a) a pair of spaced side walls defining a space through which the containers pass from an entrance opening to an exit opening along a centerline, each side wall having opposite end surfaces adjacent the entrance and exit openings, respectively, each end surface being inclined with respect to the center line so as to reduce the amount of stagnant ambient air at the entrance and exit opening and to thereby reduce the amount of output that escapes through the entrance and exit openings; (b) coating air supply means defined in at least one side wall for supplying process air comprised of a coating compound entrained in a gas, to the containers in the space; (c) exhaust means defined in at least one side wall for receiving an output from the space; and (d) means for introducing a coating compound to the coating air supply means.

In accordance with yet another aspect of the present invention, a coating hood for applying uniform protective coatings to glass containers, includes (a) a pair of spaced side wall defining a space through which the containers pass from an entrance opening to an exit opening; (b) coating air supply means defined in at least one side wall for supplying process air comprised of a coating compound entrained in a gas, to the container; (c) exhaust means defined in at least one side wall for receiving an output from the space the distance between the entrance and exit openings and the respective nearest exhaust means being a multiple of the distance between the spaced side walls; and (d) means for introducing a coating compound to the coating air supply means.

In accordance with a further aspect of the present invention, a coating hood for applying uniform protective coatings to glass containers, includes (a) a pair of spaced side walls defining a space through which the containers pass from an entrance opening to an exit opening; (b) coating air supply means defined in at least one side wall for supplying process air comprised of a coating compound entrained in a gas, to the containers; (c) exhaust means defined in at least one side wall for receiving an output from the space; (d) means for introducing a coating compound to the coating air supply means; and (e) means for disturbing a film of the coating compound surrounding the containers in the space and for diluting the concentration of the coating compound in the film.

In accordance with a still further aspect of the present invention, a coating hood for applying uniform protective coatings to glass containers, includes (a) a pair of spaced side walls defining a space trough which the containers pass from an entrance opening to an exit opening; (b) coating air supply means defined in at least one side wall for supplying process air comprised of a coating compound entrained in a gas, to the containers; (c) exhaust means defined in at least one side wall for receiving an output from the space; (d) means for introducing a coating compound to the coating air supply introducing a coating compound to the coating air supply means; and (e) means for reducing the amount of the output contained in parcels between the container from escaping from the coating hood with the containers.

In accordance with a yet further aspect of the present invention, a coating hood for applying uniform protective coatings to glass containers, includes (a) a pair of spaced side walls defining a space through which the containers pass from an entrance opening to an exit opening; (b) coating air supply means defined in at least one side wall for supplying process air comprised of a coating compound entrained in a gas, to the container; (c) exhaust means defined in at least one side wall for receiving an output from the space, the exhaust means including at least one exhaust slot extending vertically along the at least one side wall and suction means connected to at least one exhaust slot; (d) baffle means positioned in blocking relation to the at least one exhaust slot for providing substantially equal exhaust in the vertical direction through the at least one exhaust slot, the baffle means including an opening substantially midway between the upper end and a lower end of the at least one exhaust slot to provide the substantially equal exhaust in the vertical direction; and (e) means for introducing a coating compound to the coating air supply means.

In accordance with another aspect of the present invention, a coating hood for applying uniform protective coating to glass containers, includes (a) a pair of spaced side walls defining a space through which the containers pass from an entrance opening to an exit opening; (b) coating air supply means defined in at least one side wall for supplying process air comprised of a coating compound entrained in a gas, to the containers; (c) exhaust means defined in at least one side wall for receiving an output from the space, the exhaust means including at least one exhaust slot extending vertically along the at least one side wall and suction means connected to at least one exhaust slot; (d) baffle means positioned in blocking relation to the at least one exhaust slot for providing substantially equal exhaust in the vertical direction through the at least one exhaust slot, the baffle means including a plurality of baffle openings space therealong in the vertical direction, the baffle openings decreasing in size from the upper end to a lower end of the at least one exhaust slot; and (e) means for introducing a coating compound to the coating air supply means.

In accordance with yet another aspect of the present invention, a coating hood for applying uniform protective coating to glass containers, includes (a) a pair of spaced side walls defining a space through which the containers pass from an entrance opening to an exit opening; (b) coating air supply means defined in at least one side wall for supplying a coating compound entrained in a gas to the containers ; (c) exhaust manes defined in at least side wall for receiving an output from the space; (d) means for introducing a coating compound to the coating air supply means; and (e) pressure adjustment means for maintaining pressures at opposite ends of the coating hood substantially equal.

In accordance with a further aspect of the present invention, a coating hood for applying uniform protective coatings to glass containers, includes (a) a pair of spaced side walls defining a space through which the containers pass from an entrance opening to an exit opening; (b) coating air supply means defined in at least one side wall for supplying a coating compound entrained in a gas to the containers; (c) exhaust means defined in at least one side wall for receiving an output from the space; (d) means for introducing a coating compound to the coating air supply means; and (e) exhaust hood means positioned above and outside of the coating hood adjacent the entrance and exit openings for exhausting the output that escapes from the coating hood.

In accordance with a still further aspect of the present invention, a coating hood for applying uniform protective coatings to glass containers containing a main body and finish, includes (a) a pair of spaced side walls defining a space through which the containers pass from an entrance opening to an exit opening along a centerline, each side wall having opposite end surfaces adjacent the entrance and exit openings, respectively, each end surface being inclined with respect to the centerline so as to reduce the amount of stagnant ambient air at the entrance and exit openings and to thereby reduce the amount of output that escapes through the entrance and exit openings; (b) coating air supply means defined in at least one side wall for supplying a coating compound entrained in a gas to the containers; (c) exhaust means defined in at least one side wall for receiving an output from the space, the exhaust means including at least one exhaust slot extending vertically in at least one of the side walls and suction means connected to an upper end of the at least one exhaust slot, each exhaust slot being inclined at an angle away for a respective closest one of the entrance and exit openings to reduce the amount of the output that escapes through the entrance and exit openings, and the distance between the entrance and exit opening and the respective nearest exhaust slot being a multiple of the distance between the spaced side walls; (d) baffle means, having at least one opening and positioned in blocking relation to the at least one exhaust slot, for providing substantially equal exhaust in the vertical direction through the at least one exhaust slot; (e) means for introducing a coating compound to the coating air supply means; (h) exhaust hood means positioned above and outside of the coating hood adjacent the entrance and exit openings for exhausting the output that escapes from the coating hood; (f) means for disturbing a film of the coating compound surrounding the containers in the space and for diluting the concentration of the coating compound in the film; (g) means for reducing the amount of the output contained in parcels between the containers from escaping from the coating hood with the container; (h) pressure adjustment means for maintaining pressures at opposite end of the coating hood substantially equal; and (i) exhaust hood means positioned above and outside of the coating hood adjacent the entrance and exit openings for exhausting the output that escapes from the coating hood.

The above and other objects, features and advantages of the present invention will become readily apparent from the following detailed description which is to be read in connection with the accompanying drawings.

BRIEF DESCRIPTION OF THE DRAWINGS

FIG. 9 is a schematic view of a portion of coating hood in accordance with an aspect of the present invention;

FIG. 14 is a schematic view of a portion of a coating hood, illustrating a problem therewith;

FIG. 15 is a schematic view of a portion of a coating hood in accordance with another aspect of the present invention, which overcomes the problem of the coating hood of FIG. 14;

FIG. 17 is a schematic view of a portion of an exhaust section of a coating hood, illustrating a problem therewith;

FIG. 18 is a schematic view of a portion of a coating hood in accordance with another aspect of the present invention, which overcomes the problem of the coating hood of FIG. 17;

DETAILED DESCRIPTION OF THE PREFERRED EMBODIMENTS

Figure 1:
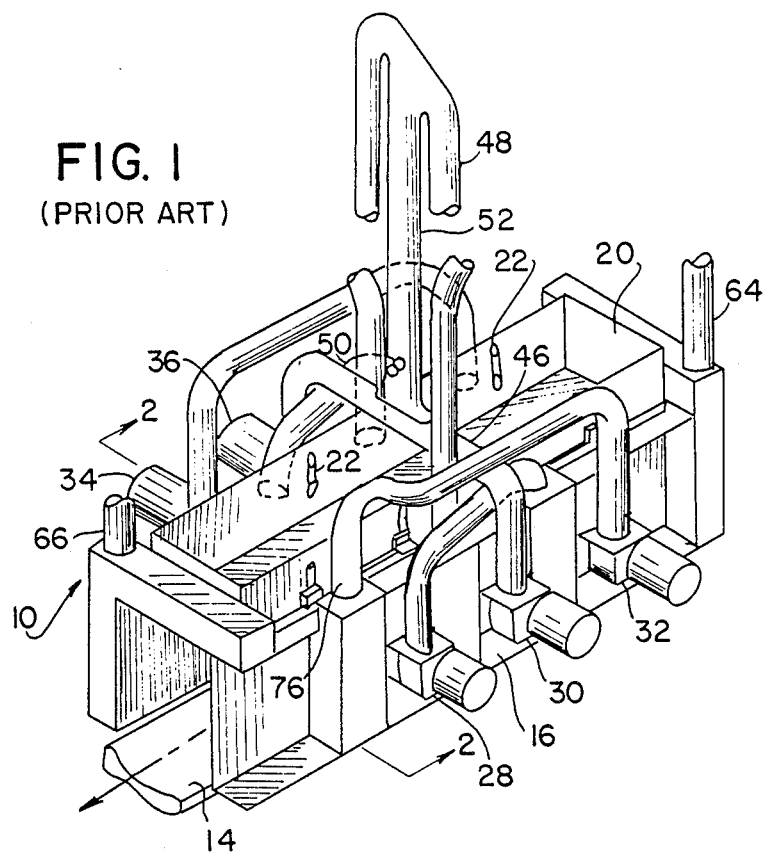
FIG. 1 is a perspective view of a first conventional coating hood.
Figure 2:
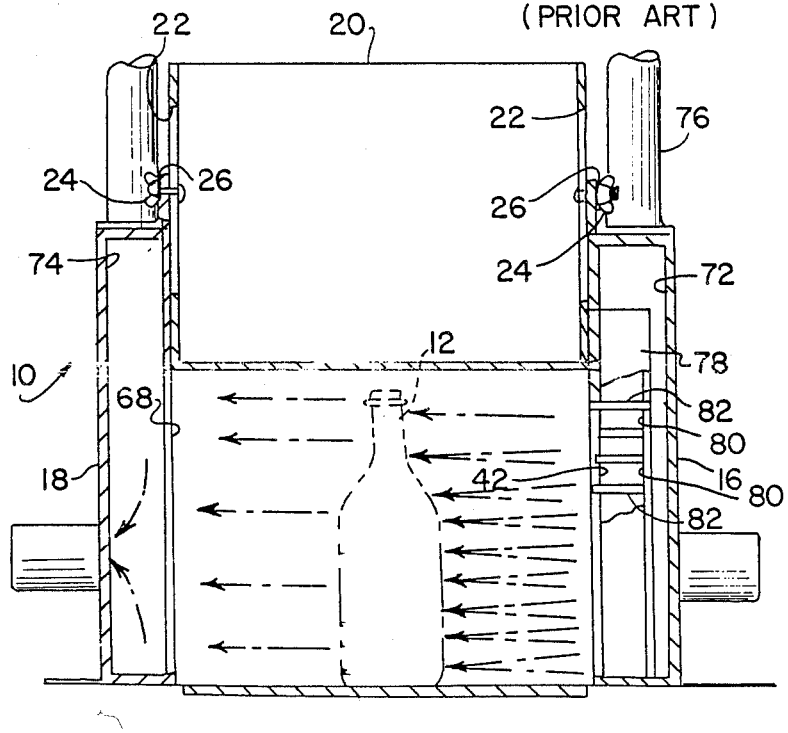
FIG. 2 is a vertical cross-sectional view of the coating hood of FIG. 1, such view being taken along line 2—2 in FIG. 1 and in the direction indicated.
Figure 3:
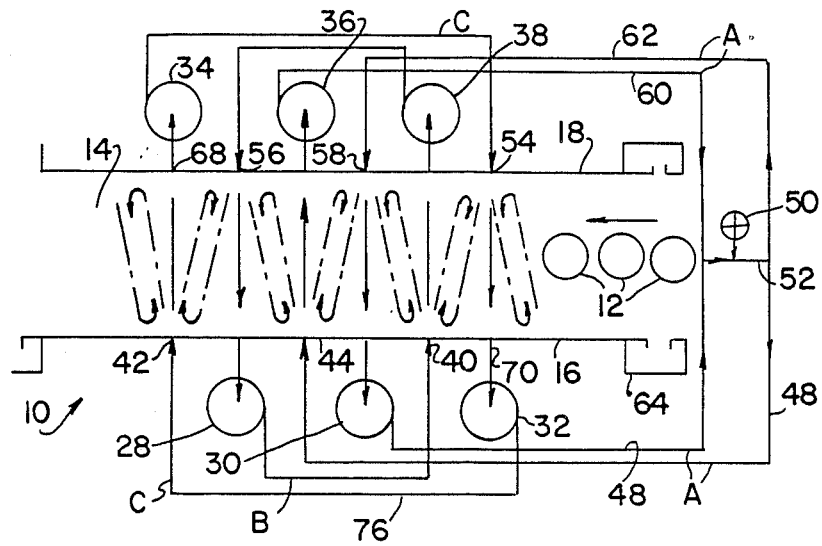
FIG. 3 is a schematic view of the recirculating flow paths established within the coating hood of FIG. 1.

Referring to the drawings in detail, and initially to FIGS. 1-3, there is illustrated the essential aspects of the coating hood disclosed in detail in U.S. Pat. No. 4,389,234, granted June 21, 1983, to Georg H. Lindner, and assigned to M&T Chemicals, Inc. of Woodbridge, N.J., the assignee of the instant application, the entire disclosure of which is incorporated herein by reference. Such coating hood is briefly described hereinafter.

The coating hood is identified generally by reference numeral 10, and glass containers 12 to be coated are moved through the interior of the hood by conveyor 14. Hood 10 includes spaced side walls 16, 18 and an upwardly opening rectangular roof 20 extend laterally across the hood. Slots 22 are formed in the roof, and ears 24 are situated at the upper end of each side wall. Fasteners 26 extend through ears 24 and into slots so that the roof 20 may be adjusted vertically relative to the side walls, thus allowing the hood to accommodate glass containers of different heights.

Side wall 16 is divided into six distinct chambers by vertically extending interior partitions (not shown), and side wall 18 is divided in a similar fashion. Blowers 28, 30 and 32 are secured to side wall 16, and blowers 34, 36 and 38 are secured to the opposite side wall.

Jet slots 40 and 42 are formed in side wall 16 to discharge the high velocity flow from blowers 28 and 32, respectively. Jet slot 44 is formed in side wall 16 to discharge the high velocity flow, while conduits 46, 48 lead the high velocity flow past feedpoint 50 in control leg 52 before returning to jet slot 44. The coating compound to be applied to the glass containers is introduced into the hood at feedpoint 50.

Jet slots 54 and 56 formed in side wall 18 top discharge the high velocity flow from blowers 34 and 38, respectively. Jet slot 58 is formed in side wall 18 to discharge the high velocity flow from blower 36, while conduits 60, 62 lead the high velocity flow past feedpoint 50 in central leg 52 before returning to jet slot 58. An exhaust port 64 is located at the entrance of the coating hood, and another exhaust port 66 is located at the exit of the coating hood.

A receiver slot is formed in the side wall opposite each jet slot, as indicated in FIG. 3. For example, receiver slot 68 is formed in the inner face of side wall 18 opposite jet slot 42, and receiver slot 70 is formed in the inner face of side wall 16 opposite jet slot 54. Receiver slot 68 allows the high velocity air traversing the width of the coating hood to flow into the intake side of blower 34, while receiver slot 70 allows the high velocity air traversing the coating hood to flow into the intake side of blower 32. By the judicious placement of jet slots and receiver slots, coating hood 10 produces three separate recirculating loops, or flow paths. for the high velocity air (with coating compound entrained therein) passing therethrough. The loops are identified as loops A, B and C in FIG. 3. Loop A is the innermost recirculating loop, loop B in the intermediate recirculating loop, and loop C is the outermost recirculating loop. The coating compound is introduced into loop A at feedpoint 50, and eddy currents transfer the coating compound to the outer loops B and C, though at reduced concentrations. The glass container 12 passing through the coating hood are thus coated repeatedly, and in opposing directions, by the coating compound entrained in the high velocity air streams. The recirculating loops have greatly enhanced the performance of coating hood 10 while significantly reducing the consumption of coating compound.

FIG. 2 reveals that the side walls 16, 18 of coating hood 10 are divided into separate chambers. Chambers 72 and 74 are representative of these chambers. Jet slot 42 is located in the interior face of chamber 72, and receiver slot 68 is located in the interior face of chamber 74. The high velocity air is introduced into chamber 72 via conduit 76 leading from blower 32. After passing across the width of the hood and entering chamber 74, the high velocity air is drawn into the intake side of blower 34.

A baffle 78 is situated in the chamber 72 so that the high velocity air must flow therethrough prior to passing through jet slot 42. Several apertures 80 are formed through rear wall of the baffle, and the apertures cooperate with horizontally extending ribs 82 to divide the air stream into several vertically spaced streams. The streams, which have coating compound entrained therein, efficiently coat the glass containers passing thereby.

Figure 6:
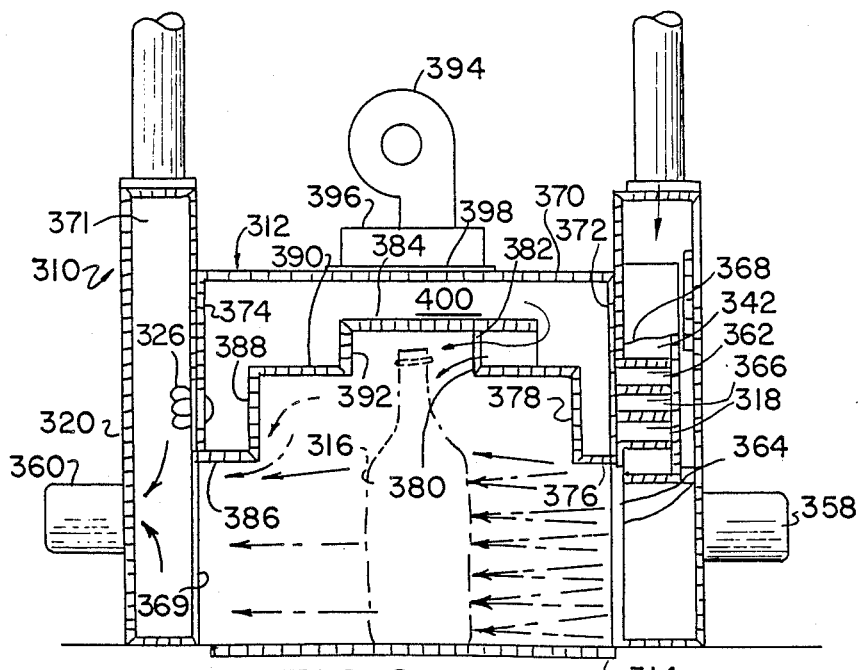
FIG. 6 is a vertical cross-sectional view through the coating hood of FIG. 4.
Figure 4:
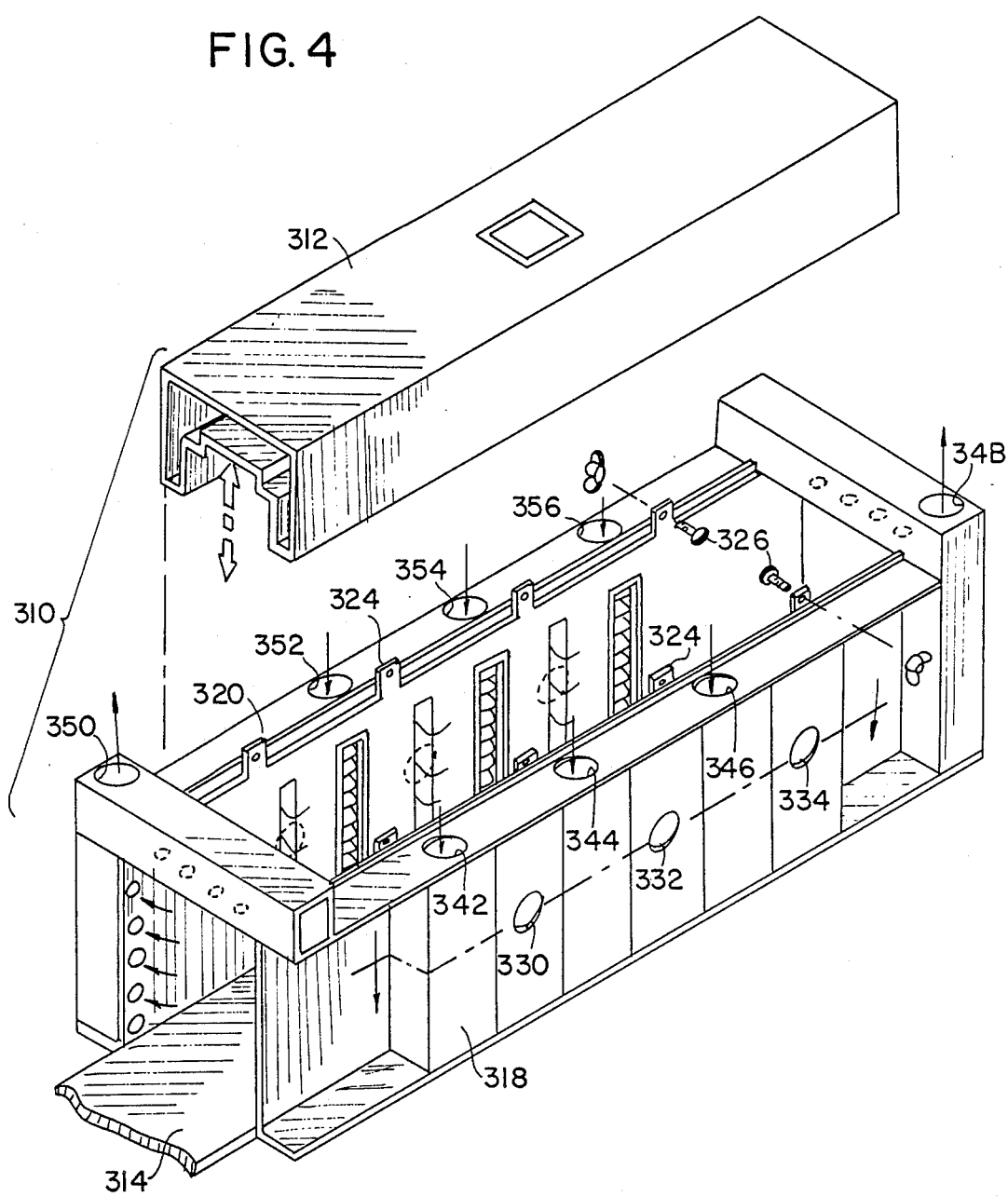
FIG. 4 is an exploded perspective view of a coating hood employing an air flow guide constructed in accordance with the principles of the parent of this application.
Figure 5:
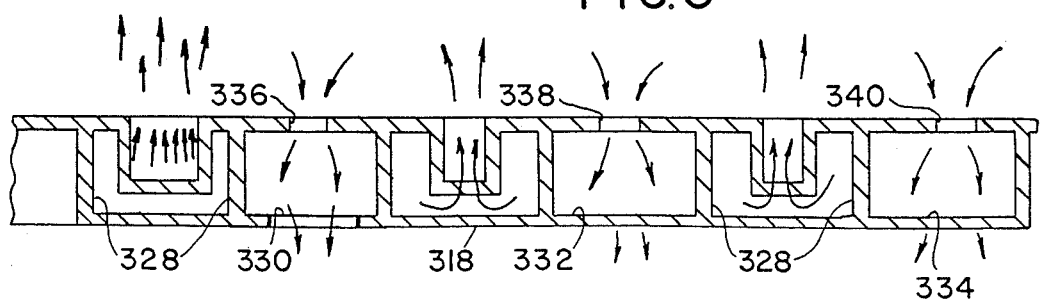
FIG. 5 is a fragmentary, horizontal cross-sectional view through a side wall of the coating hood of FIG. 4, such view being taken along line 5—5 and in the direction indicated.

Referring now to FIGS. 4–6, there is shown a coating hood 310 employing an air flow guide 312 constructed in accordance with the principles of the invention of U.S. Pat. No. 4,684,046, the entire disclosure of which has been incorporated herein by reference. The invention described in such Patent Application and reproduced below relates to prevention of coating on the finish of containers, and is only reproduced to show the state of the art.

Coating hood 310 is similar in structural detail and operational characteristics to coating hood 10 described briefly above, and described in detail in U.S. Pat. No. 4,389,234. However, the upwardly opening rectangular roof 20 of coating hood 10 has been replaced by a unique air flow guide 312, with numerous attendant advantages that will become apparent hereinafter. It will be appreciated from the discussion which follows, however, that the present invention is not limited to this particular coating hood, which is merely described in order to better illustrate the present invention; but rather, has wide applicability to any of the above prior art (and other) coating hoods.

A conveyor 314 advances glass containers 316 longitudinally, and in single file, through the interior of the hood. Hood 310 includes spaced side walls 318, 320, and the air flow guide 312 extends laterally therebetween. Ears 324 are situated in the upper end of each side wall. Fasteners 326 extend through the ears 324 into the slots so that guide 312 may be adjusted vertically relative to the side walls, thus allowing the hood to accommodate glass containers of different heights.

Side wall 318 is divided into six distinct chambers by vertically extending interior position walls 328, visible in FIG. 5. Three blowers (not shown in FIGS. 4 and 5) are secured to side wall 318. The inlet, or low pressure side, of a first blower is connected to aperture 330 in the second chamber of the side wall 318. The inlet of a second blower is connected to aperture 332 in the fourth chamber of the side wall 318, and the inlet of a third blower is connected to aperture 334 in the sixth chamber of the side wall 318. Apertures 330, 332 and 334 are aligned with receiver slots 336, 338 and 340, respectively, as shown in FIG. 5. The first, third, and fifth chambers receive high velocity air stream from other blowers through inlet ports 342, 344 and 346, and discharge such streams across the width of the coating hood. An exhaust port 348 is situated at the entrance to coating hood 310, and a second exhaust port 350 is situated at the exit from the coating hood.

Side wall 320 is divided into six distinct chambers in a similar manner. Three blowers (also not shown) are secured to side wall 320. High velocity streams of air are introduced into the second, fourth, and sixth chambers in side wall 320 by inlet ports 352, 354 and 356. The paths of movement for the various air streams flowing through coating hood 310 are indicated by directional arrows. It is noted that the blower and related conduits have been omitted in order to enhance the clarity of the remaining components.

FIG. 6 is a vertical cross-sectional view through coating hood 310 showing a representative chamber, such as the first chamber in side wall 318. One of the motors 358 which drives one of the three blowers secured to side wall 318 is visible at one side of the hood, while one of the motors 360 which drives one of the three blowers secured to side wall 320 is visible at the opposite side of the hood. High velocity air enters the chamber through inlet port 342, flows downwardly through baffle 362 before passing through jet slot 364 into the interior of coating hood 310. Apertures 366 in the baffle are larger at their entrance than at their exit, and ribs 368 coact with the apertures to enhance the flow uniformity of the high velocity air stream. The flow passes across the coating hood and enters receiver slot 369 defined at the entrance to the first chamber 371 in side wall 320. The compound is introduced into the air stream at a feedpoint (not shown). The side wall of air flow guide 312 covers the upper end of the jet slot 364 and blocks passage of the high velocity air stream therethrough.

Air flow guide 312 fits between side walls 318 and 320 and completes the coating hood 310. The guide can be adjusted vertically so that glass containers of different heights can be coated. Also, the flow guides can be formed in different widths, so that the lateral dimension of the coating hood can be adjusted to accommodate containers of greater, or less, widths.

As shown in FIG. 6, air flow guide 312 includes a horizontal roof 370, a first depending side wall 372, and a second depending side wall 374. A horizontal step 376 extends inwardly from side wall 372, and a vertical riser 378 extends upwardly therefrom toward a larger step 380. A second riser 382 extends upwardly above step 380, and an inner top wall 384 extends across the middle of the coating hood toward depending side wall 374.

A horizontal step 386 extends inwardly from side wall 374, and a vertical riser 388 extends upwardly therefrom toward a larger step 390. Another riser 392 extends upwardly above step 390, and the top wall 384 joins spaced risers 382 and 392. The stepped underside of guide 312 reduces the width across the upper end of the hood.

A blower 394 is secured to a pedestal 396 secured to the upper surface of the flow guide. Blower 394 furnishes finish air through aperture 398 to the plenum 400 defined within the interior of the flow guide.

The high velocity stream of air with coating compound entrained therein from jet slots 364 to receiver slot 369 is indicated by the directional arrows shown in FIG. 6. Baffle 362 enhances the flow characteristics of the stream of air, and improves the uniformity, and reproducibility, of the coating applied to the body of the glass containers 316. The air flow guide 312 introduces a much smaller, low velocity stream of finish air into the upper end of the coating hood 310, the finish air being supplied by blower 394. The configuration of the underside of the air flow guide reduces the lateral internal dimesion of the coating hood in the vicinity of the finish of the glass containers passing therethrough.

Consequently, although the vapor free finish air supplied by blower 394 may be furnished at a reduced volume, and even at a lower velocity than the air flow exiting jet slot 364, the finish air minimizes the unwanted deposition and/or accumulation of coating compound on the threads and neck of the glass containers. Simultaneously, the finish air flow does not interfere with the coating being applied to the body of each container. The finish air functions as an effective internal air curtain, and intermixing between the vapor free finish air and the high velocity air stream with the coating compound entrained therein is minimal, as will now be described in greater detail. The flow patterns for the finish air, and the high velocity air stream, are indicated by directional arrows in FIG. 6. The two separated flows are combined after passing through receiver slot 369 into chamber 371, and are recirculated through appropriate conduits for coating additional containers 316.

Figure 7:
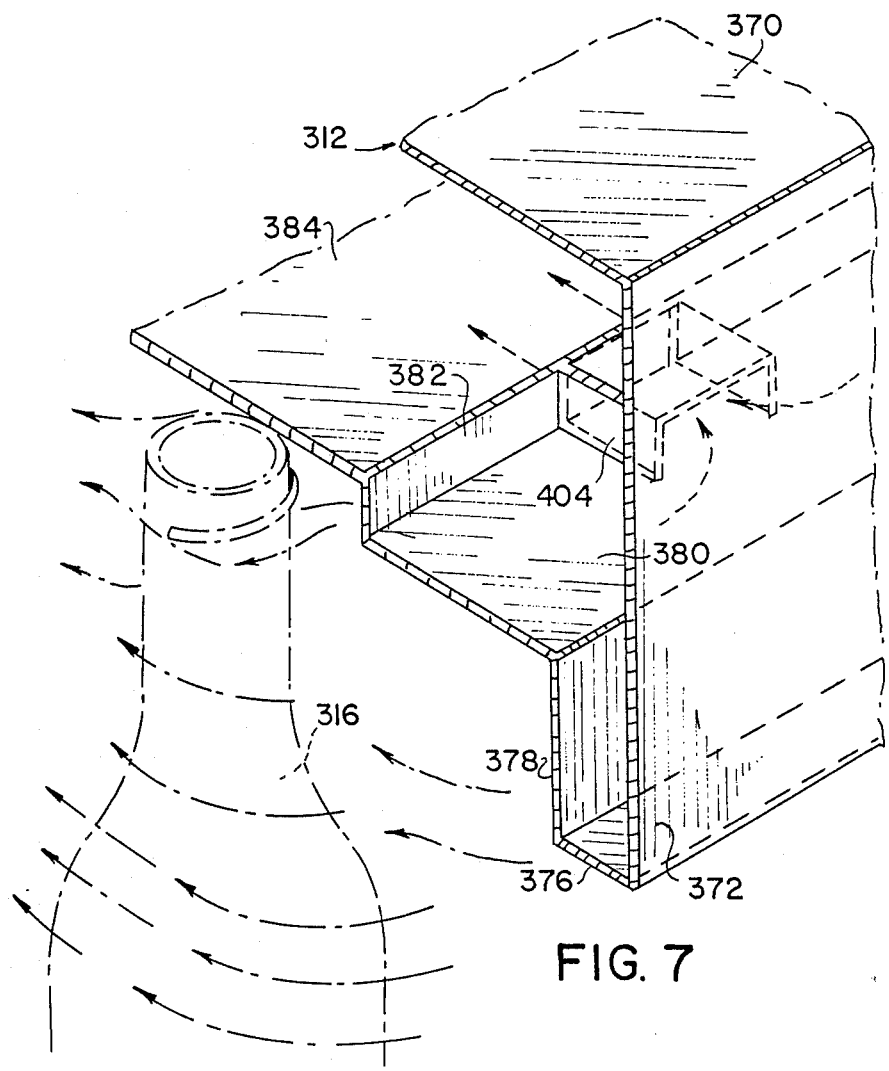
FIG. 7 is a fragmentary, perspective view of the air flow guide, such view being taken on an enlarged scale.
Figure 10:
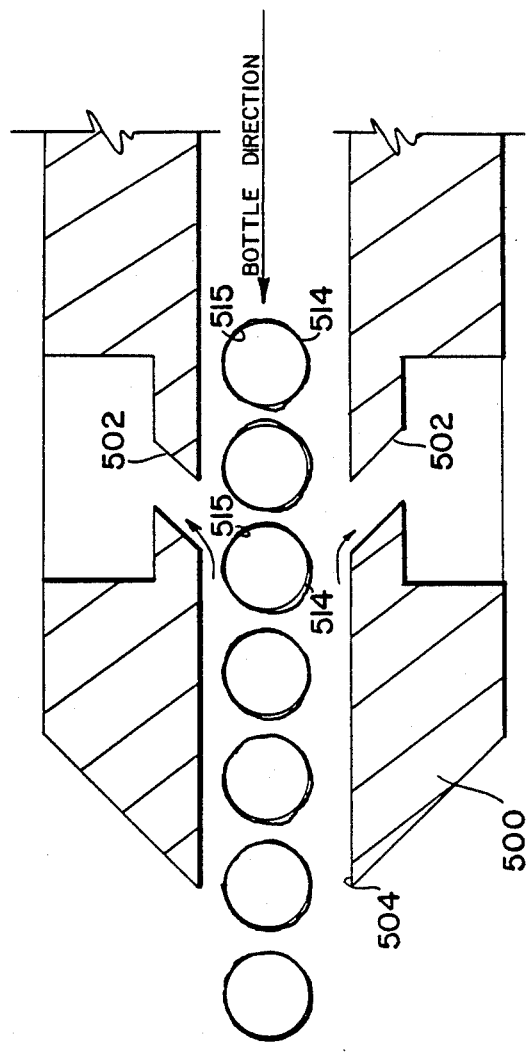
FIG. 10 is a schematic view of a portion of a coating hood, illustrating a problem therewith.

Specifically, FIG. 7 is a perspective view of a fragment of air flow guide 312, such view being taken on an enlarged scale to better depict selected structural features of the guide 312. Blower 394 introduces a stream of finish air, that is, without any coating compound contained therein, into chamber 400 defined in the interior of guide 312. The air is routed through U-shaped tunnels 404 and passes over the threads on the upper end of the neck of container 316. The vapor free air passing through tunnels 404 preferably travels in the same direction as the flow of the high velocity air streams passing over the body of container 316, although the directions of travel may be opposite to each other, and in the case of other types of coating hood may have no relation to each other at all.

Figure 8:
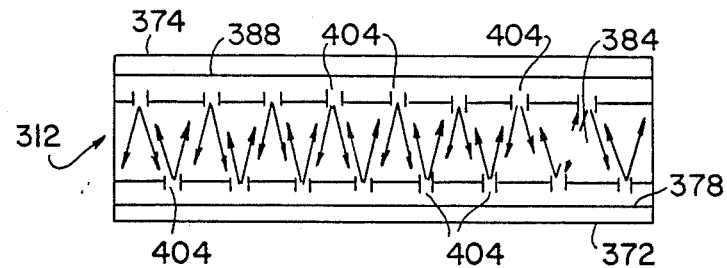
FIG. 8 is a schematic view of the flow paths for the finish air established within the coating hood of FIGS. 4-7.

FIG. 8 schematically shows that a plurality of tunnels 404 are defined in risers 382 and 392, but the tunnels are offset relative to each other, as will be explained in more detail below. In addition, it is important that tunnels 404 substantially extend along the entire length of the hood. Each tunnel 404 is preferably disposed above a jet slot defined in the side walls 318 and 320 of the hood 310, and the tunnels 404 therefore preferably direct finish air flow in the same direction as the jet slots direct the high velocity air stream with the coating compound contained therein. As an example, tunnels 404 may each have a width (in the direction of travel of the containers) of approximately 0-5 cm (preferably 2-4 cm) and a height of approximately 0.5-2 cm.

It is important that tunnels 404 are separated from the coating air slots 364, whereby the finish air streams are blown across the finish of the containers in a specific configuration. Specifically, it is important that the finish air jets exiting from tunnels 404 on both sides of the coating hood be provided in alternating sequence, as shown in FIG. 8, that is, finish air jets on one side being offset in the direction of travel of the containers from the finish air jets on the other side. Thus, since the air from the finish air jets emerges at a diverging angle, the finish air jets form an envelope with lateral boundaries, with the lateral boundaries of one envelope on one side being substantially coincident with the lateral boundaries of the two laterally offset and adjacent boundaries on the other side of the coating hood. At an initial jet speed of some 2 to 4 m/sec., the enveloping jet angle was found to be close to 20 degrees.

As a result, a quiet zone between two finish air jets blowing from one side is completely filled with moving air from one of the opposing finish air jets blowing from the other side, without interference between the opposing finish air jets. This means that intermixing of the finish air jets at the lateral boundaries of the envelopes thereof only occurs with other finish air jets, since there is no quiet zone which can be reached by a coating air jet. Thus, each finish air jet is only in contact with the coating air in the lower part of the hood, that is, at the lower part of the finish air curtain, so that intermixing of the coating air with the finish air is minimized and the finish air contacting the container finish is effectively free of coating compound. In addition, there is no effective increase in the amount of coating compound consumed.

In order to further minimize any intermixing of the finish air and coating air, tunnels 404 are spaced above and separated from the upper end of the jet slots 364 discharging the high velocity air stream containing the coating compound. The vertical spacing pattern improves the efficiency of the finish air stream and further reduces and/or minimizes the undesirable accumulation of coating compound on the threads and neck of containers 316. Specifically, tunnels 404 are situated from approximately 2-8 cm above the coating jet slots 364 through which the coating air enters the hood. This separation can be effected by side walls 372 and 374 and with risers 378 and 388 having a height of approximately 2-8 cm, thereby providing a blocking skirt for the coating air jets.

In order to further minimize intermixing of the finish air and coating air, the hood is inwardly displaced as a result of steps 376, 380, 386 and 390 and riser 378, 382, 388 and 392, with tunnels 404 being provided in risers 382 and 392, as shown. Thus, the finish air has to travel over a smaller distance than the coating air before it reaches the containers, so that it is less likely that the finish air will be contaminated by the coating air. It will be noted that, in general, the finish of a bottle is smaller in diameter than the main body of the container. Therefore, the hood wall may be inwardly displaced by the aforementioned steps and risers, without causing a restriction to the passage of the containers through the hood. This is important, taking into consideration various misalignments encountered in normal plant operation.

With the above as background to the present invention, the different aspects of the present invention which lead to minimizing exhaust fumes from a coating hood will now be described with reference to FIGS. 9-20.

In order to minimize the escape of fumes from the coating hood, it is important that the amount of air exhausted from the coating hood must be greater than the quantity of ambient air flowing into the hood and the quantity of finish protection air injected into the hood from the upper section. With the aforementioned hoods, there has been an indication that the amount of exhaust is insufficient since fumes are constantly escaping from the coating hood. However, as aforementioned, it is not desirable to increase the amount of exhaust from the hood since this has the side effect of extracting a higher percentage of circulating air from the outer air loop, and thereby decreasing the efficiency of the coating process.

In accordance with a first aspect of the present invention, the amount of exhaust is increased without increasing the amount of process air that is exhausted. In other words, since the amount of process air exhausted remains substantially the same and the total amount of exhaust is increased, the additional amount of exhaust derives from ambient air that enters the coating hood. As shown in FIG. 9, in a coating hood 500, which may be similar to the coating hood of FIG. 4, exhaust slots 502 in the side walls of coating hood 500 are angled away from the open end 504 of coating hood 500. Although only two exhaust slots 502 are shown, it will be appreciated that exhaust slots 502 at the opposite open end (not shown) of coating hood 500 are also angled away from such opposite open end. Thus, thee is a greater amount of exhaust escaping through exhaust slots 502 into exhaust plenums 506.

Because of this arrangement, the average velocity $V_A$ of ambient air entering the end of the hood due to exhaust suction will be greater than the average velocity $V_D$ of process air pulled toward exhaust slots 502. This has the advantage that more ambient air is entering the ends of both sides of the hood, making it difficult for process air to escape. Preferably, the angle of inclination is approximately 45 degrees with respect to the direction of bottle movement. As a result of the angling of exhaust slots 502 in a direction away from he open ends 504 of coating hood 500, less ambient air enters the central portion of coating hood 500, where the coating process occurs.

Further, with known hoods, the open ends 504 are generally formed as blunt ends, that is, the outer walls at the opposite ends of the coating hoods are formed at substantially right angles to the direction of movement of bottles 515. However, as moving ambient air hits the blunt ends, such air stagnates, forming a resulting pressure increase that helps to push ambient air into the coating hood.

In accordance with another aspect of the present invention, as also shown in FIG. 9, the opposite ends 504 of coating hood 500 are formed at an angle, that is, with angled outer end surfaces 508 that are angled away from open end 504. This angled entrance permits ambient air to flow around coating hood 500 without stagnating at open ends 504, thereby reducing the build up of positive pressure outside the entrances to coating hood 500. This lower stagnation pressure decreases the flow of excess ambient air into coating hood 500.

In accordance with still another aspect of the present invention, in order to make it more difficult for process air to escape, the distance between the open ends 504 of coating hood 500 and exhaust slots 502 can be increased, as shown in FIG. 9. Specifically, if exhaust slots 502 are positioned near open ends 504, parcels of process air will escape into the ambient atmosphere. By positioning exhaust slots 502 at a further distance from open ends 504, any process air, for example, process air parcel 510, that tries to escape, must flow in a direction which is opposite to that of the prevailing flow direction which is toward exhaust slots 502. This means that more energy must be given up by the escaping parcel 510 during its travel from a position within coating hood 500 corresponding to exhaust slots 502 and the open end 504 of the coating hood. As a result, parcel 510 is stopped and turned back toward exhaust slots 502, as indicated by arrow 512.

In other words, process air parcel 510 has an initial velocity $V_D$. As process parcel 510 escapes past exhaust slots 502 toward open end 504, it slows down as it moves toward open end 504 due to the work performed against incoming ambient air. If the distance between exhaust slots 502 and open end 504 is large, the energy of parcel 510 is used up as it flows against the prevailing flow direction, whereby parcel 510 slows down, stops and finally reverses direction, whereupon it is pulled back into exhaust slots 502. This occurs at both open ends of coating hood 500. The greater distance between exhaust slots 502 and open end 504 also results in a larger mixing time between escaping process air parcels 510 and the incoming ambient air, resulting in a more dilute process air parcel escaping, even if it manages to reach open ends 504 of coating hood 500.

It is to be noted that, the wider the distance between the two sides of coating hood 500, as required for different width bottles, the longer the distance should be between exhaust slots 502 and open ends 504 of coating hood 500. This is because the side exhaust from exhaust slots 502 is not as effective for exhausting air near the center line of coating hood 500 at greater widths. Therefore, with such greater widths, a longer dimesion between exhaust slots 502 and open ends 504 of coating hood 500 will help facilitate mixing of the process air along the hood center line before it escapes. As a general rule, it is desirable to make the distance between exhaust slots 502 and open ends 504 of coating hood 500 a multiple of the width between the two sides of coating hood 500.

Thus, FIG. 9 illustrates three ways of minimizing the escape of process air into the ambient atmosphere.

Another reason for the escape of process air from a coating hood is due to a boundary layer of process air with a high concentration of noxious fumes that surround the bottles and escape therewith. Specifically, friction forces between the air and bottles 515 result in thin air film 514 being built up around each bottle, which tends to move at the same rate of speed as the bottles 515. This thin film 514, however, contains a high concentration of fumes, since it is local to the material that has been deposited on bottles 515.

Figure 11:
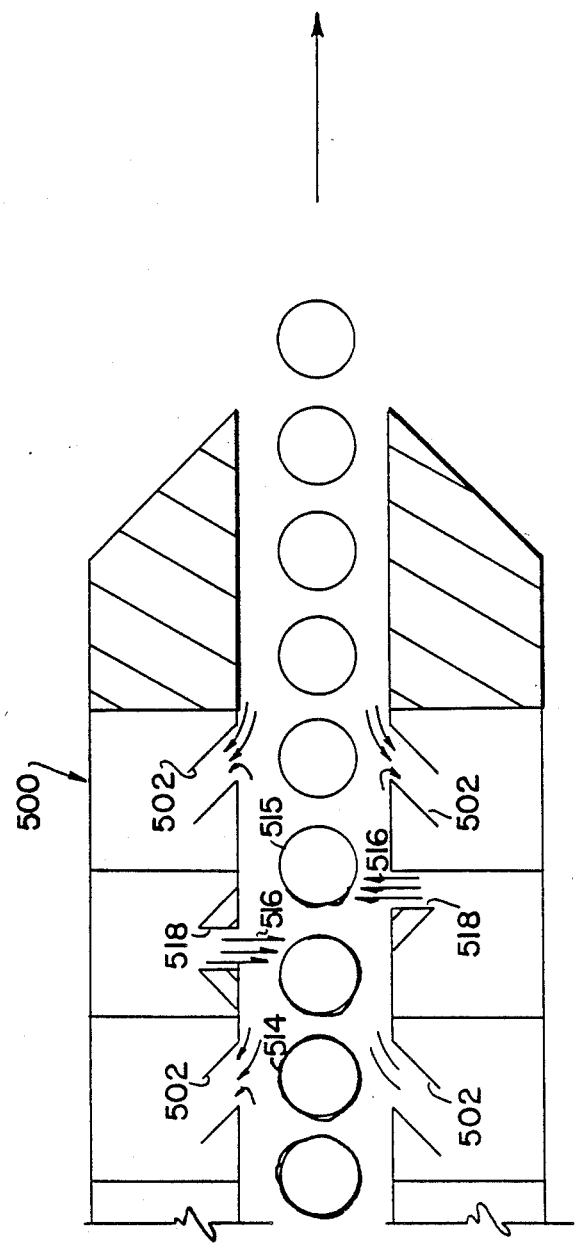
FIG. 11 is a schematic view of a portion of a coating hood in accordance with another aspect of the present invention, which overcomes the problem of the coating hood of FIG. 10.

Therefore, as shown in FIG. 11, in accordance with another aspect of the present invention, fresh coating free air 516 from supply slots 518 are provided at opposite sides of coating hood 500 so as to disturb this film so that the film 514 is exhausted through exhaust slots 502 or, at the least, the concentration of noxious chemicals in the film 514 is substantially diluted by the fresh air 516 from supply slots 518. As a result, there will be a decrease in the exhaust of such noxious fumes into the ambient atmosphere.

Figure 12:
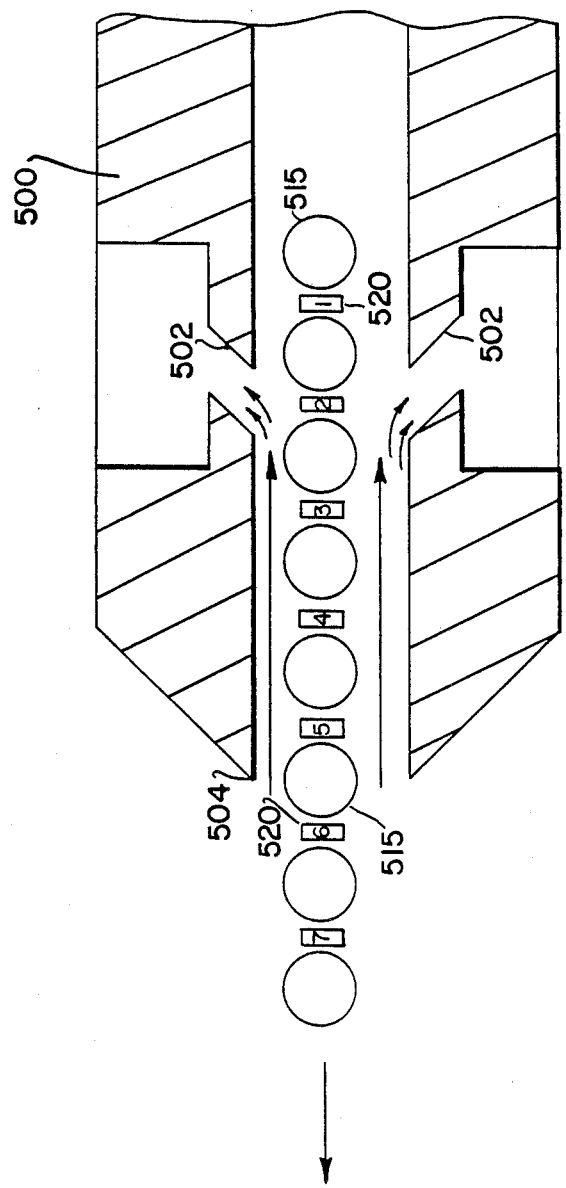
FIG. 12 is a schematic view of a portion of a coating hood, illustrating a problem therewith.
Figure 13:
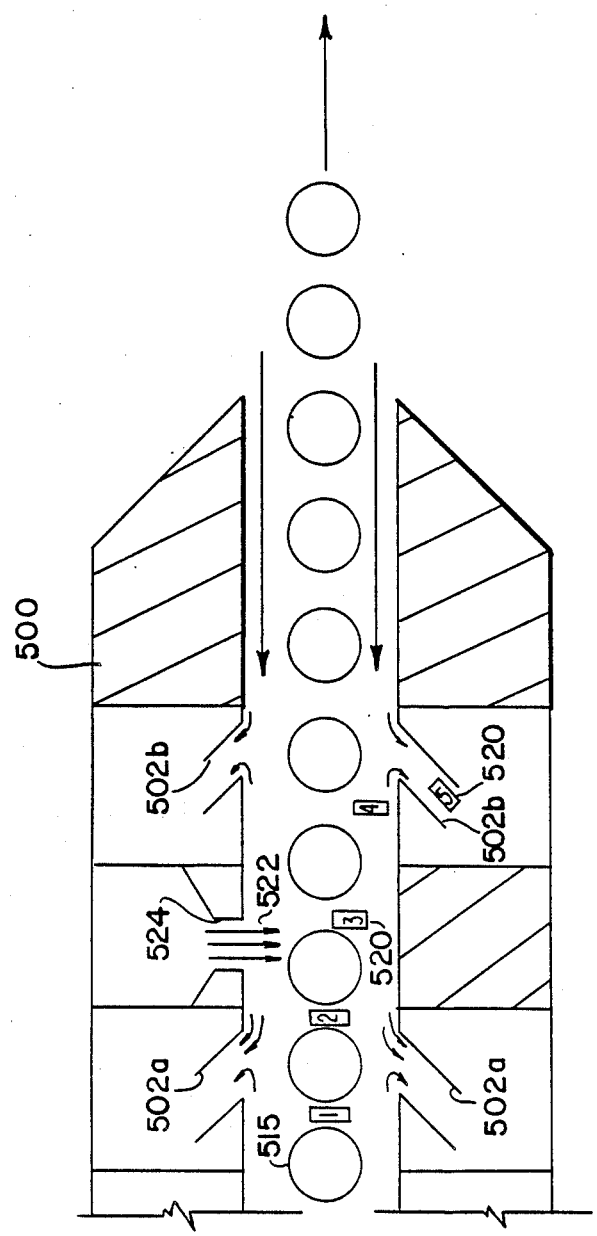
FIG. 13 is a schematic view of a portion of a coating hood in accordance with another aspect of the present invention, which overcomes the problem of the coating hood of FIG. 12.

It is also preferable, as shown in FIG. 11 that supply slots 518 be offset from each other in the direction of bottle movement, the reason for which will be more apparent from the discussion which now follows with respect to FIGS. 12 and 13.

Another mechanism that contributes to transport of process air by means of bottle 515 arises from the symmetry of the exhaust slots 502. Specifically, as shown in FIG. 12, since process air is exhausted from both sides of bottles 515 in approximately equal amounts, parcels 520 of process air lying between bottles 515 do not have any large static or velocity pressure forces encouraging them to mix as they pass through the exhaust area. The result is that fairly large parcels 520 of process air may escape from coating hood 500 between bottles 515.

In accordance with another aspect of the present invention, as shown in FIG. 13, an asymmetric jet 522 of coating free air from a slot 524 in one side of coating hood 500 in the vicinity of the exhaust area, that is, in the exhaust area of exhaust slots 502, is provided and encourages mixing of parcels 520 with the process air in coating hood 500, whereupon, the parcels 520 enter exhaust slots 502, thereby reducing the escape of process air from coating hood 500. In this regard, it is preferable that slot 524 be positioned before the last exhaust slot 502 so that the displaced parcels 520 can be easily exhausted.

As also shown in FIG. 13, in accordance with another aspect of the present invention, since mixing and subsequent dilution of process air with ambient air occurs primarily at exhaust slots 502, at least two such exhaust slots should be provided in parallel. With this feature, any process air which escapes past the first set of exhaust slots 502a inturbulent parcels will be fairly dilute in its concentration of noxious fumes, and any air that escapes past the second set of exhaust slots 502b and enters the ambient air will have a very dilute noxious fume concentration. It is also preferable that a mixing jet 524 be placed between these two slots to encourage mixing of air between the bottles and to disrupt the boundary layer of noxious fumes on each bottle, as aforementioned.

Referring now to FIG. 14, which represents a schematic vertical cross-section through a known coating hood 500, it is seen that, after the process air enters the exhaust slots 502, the process air is pulled upwardly since the exhaust connection to the exhaust plenum 506 is at the upper ends of slots 502. Because of this arrangement, there is a higher negative pressure near the top of the exhaust plenums 506. This results in higher flow rates at the top of each slot 502, causing a non-uniform exhaust of air in the vertical direction. As a result, there is an increased capability for process air to escape along the lower half of coating hood 500, where ambient air is not being drawn towards exhaust 502 with a significant velocity.

In accordance with an aspect of the present invention, as shown in FIG. 15, to overcome the problem on non-uniform exhaust in the vertical direction, a baffle 526 is provided in covering relation to each slot 502 and the respective interior plenum 528 on each side of coating hood 500. In the embodiment shown in FIG. 15, baffle 526 has a single opening 530 positioned midway between the lowest and highest open portions of the plenum 528. As a result, there is a more even pressure distribution, because the greatest negative pressure is now near the center of the slot, rather than at one end. Accordingly, any escape of process air along the lower half of coating hood 500 is minimized.

Figure 16:
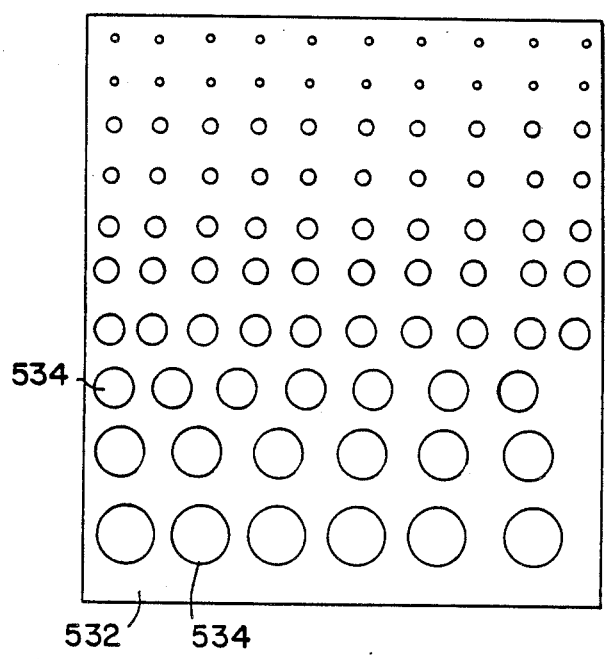
FIG. 16 is a plan view if a perforated baffle that can be used with the coating hood of FIG. 15.

In an alternative embodiment, in place of baffle 526, there is placed a perforated plate 532, shown in FIG. 16, having a plurality of openings 534 which generally decrease in size from the lower portion of coating hood 500 to the upper portion thereof. As a result, there is a more even pressure distribution throughout the entire interior plenum 528.

It should be noted that in both embodiments of FIGS. 15 and 16, there will be an increase in overall pressure drop in the system to some extent, which may result in the requirement for stronger exhaust to maintain the same air flow. In both embodiments, the increase in ambient air velocity toward the exhaust in the lower portion of coating hood 500 will help push escaping process air back toward interior plenums 528.

Figure 19:
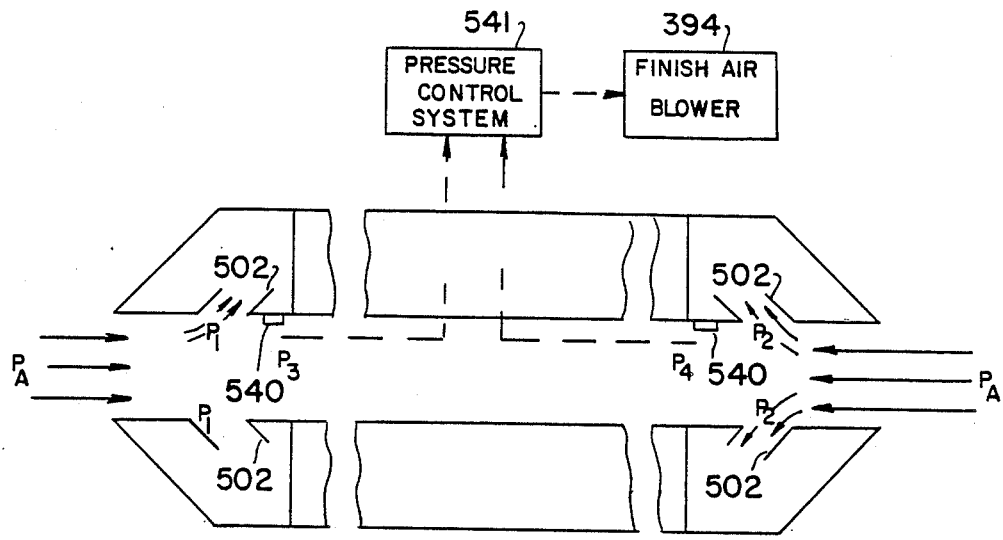
FIG. 19 is a schematic view of a portion of a coating hood, illustrating an airflow pattern problem therewith.
Figure 20:
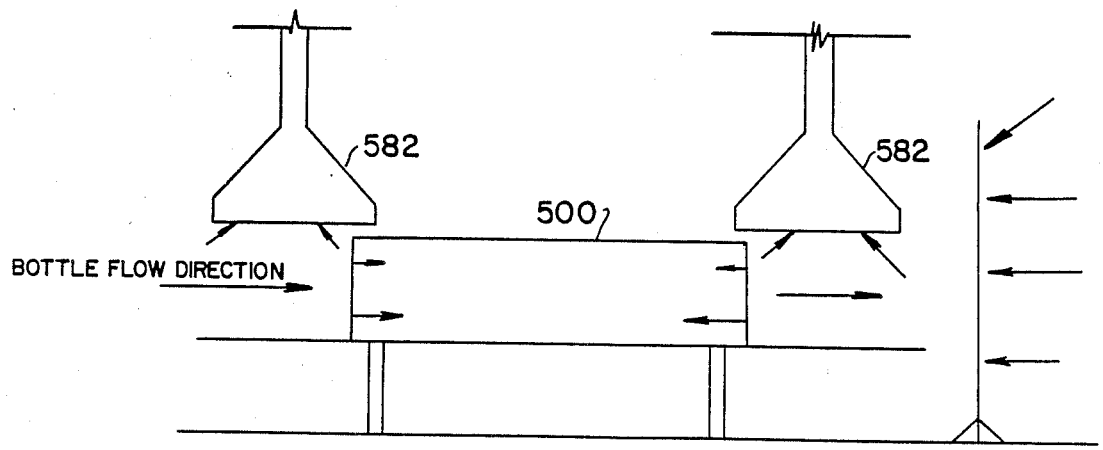
FIG. 20 is a schematic view of a portion of a coating hood in accordance with another aspect of the present invention, which overcomes the problem of the coating hood of FIG. 19.

In order to reduce the amount of ambient air entering coating hood 500, while at the same time, increasing the exhaust without substantially affecting the efficiency of the coating hood, reference will now be made to FIG. 19 with respect to another aspect of the present invention. Specifically, in accordance with this aspect of the present invention, the pressures at opposite ends of coating hood 500 are balanced, that is, made substantially equal. For example, the pressures P3 and P4 at opposite ends of coating hood 500 are maintained substantially equal to each other, either through careful balancing prior to hood operation, or through an active pressure control system which is regulated by differential pressure transducers 540 at opposite ends of coating hood 500. As to the latter, transducers can supply pressure signals to a pressure control system 541 which, in turn, controls blower 394 (FIG. 6) as to the amount of finish protection air that is supplied. Thus, if pressure P3 equals pressure P4, no ambient air can flow into opposite ends of coating hood 500, that is, the ambient air cannot flow past exhaust slots 502, that is, because of the balancing of pressures in the coating hood. Thus, finish protection air will flow equally out opposite ends of coating hood 500 through exhaust slots 502.

The basis for this operation is as follows. Once the exhaust for coating hood 500 is turned on, it will pull air from both inside coating hood 500 and air from outside coating hood 500. Once the transient pressures in the system have stabilized, however, the mass of air exhausted from the interior of coating hood 500 must, from conservation of mass considerations, be equal to the mass of finish protection air entering coating hood 500. Thus, pressure equalization at opposite ends of coating hood 500 is achieved, which insures that air is not pulled in from the exterior of coating hood 500. In this regard, a blast gate or similar flow regulator can be used to prevent the flow rate of finish air from increasing.

As a result, dilution of the process air is not increased and since the ambient air is prevented from entering the coating hood, efficiency thereof is not decreased. Accordingly, the amount of exhaust can be increased significantly without decreasing the coating hood efficiency, as long as the above-mentioned conditions are maintained. In other words, once the steady state condition is reached, the amount of exhaust can be varied without diminishing the efficiency of the coating process. Accordingly, because the exhaust can be increased to very high levels without decreasing the hood efficiency, this virtually assures that practically no parcels of process air escape into the ambient atmosphere.

It is noted that the active control system, comprised of differential pressure tranducers 540, can be used to provide a differential pressure signal between the pressures P3 and P4 as an error signal, which could be used to control the aforementioned blast gate or similar regulating device to maintain pressure equilibrium.

As an alternative and very effective method of stopping any escaping fumes from entering the ambient atmosphere, exhaust hood 542 are positioned directly above coating hood 500 at opposite open ends thereof. Such exhaust hoods 542 have large cfm capacities, but are sufficiently distant from the entrance of coating hood 500 to not appreciably affect the net flow of air into the open end of hood 500, as shown as in FIG. 20.

With all of the above aspects of the present invention, there is a substantial reduction in the amount of process air that enters the ambient atmosphere, while at the same time, there is not substantial reduction in the efficiency of the coating hood.

Having described specific preferred embodiments of the invention with reference to the accompanying drawings, it will be appreciated that the present invention is not limited to those precise embodiments, and that various changes and modifications can be effected therein by one of ordinary skill in the art without departing from the spirit or scope of the invention as defined in the appended claims.

What is claimed is:

1. A coating hood for applying uniform protective coatings to glass containers, said coating hood comprising:
   (a) a pair of spaced side walls defining as space through which said containers pass from the entrance opening to an exit opening;
   (b) coating air supply means defined in at least one side wall for supplying process air comprised of a coating compound entrained in a gas, to said containers;
   (c) exhaust means defined in at least one side wall for receiving an output from said space; and
   (d) means for introducing the coating compound to said coating air supply means;
   (e) means for substantially diluting a film of said compound surrounding and traveling said containers to prevent escape of said coating compound through said exit opening.

2. A coating hood for applying uniform protective coatings to glass containers, said coating hood comprising:
   (a) a pair of spaced side walls defining a space through which said containers pass from an entrance opening to an exit opening;
   (b) coating air supply means defined in at least one side wall for supplying process air comprised of a coating compound entrained in a gas, to said containers;
   (c) exhaust means defined in at least one side wall for receiving an output from said space;
   (d) means for introducing the coating compound to said coating air supply means;
   characterized by:
   (e) means for disturbing a film of said coating compound surrounding said containers in said space and for diluting the concentration of said coating compound in said film.

3. A coating hood according to claim 2; further characterized in that said means for disturbing includes fresh air supplying means defined in at least one side wall for supplying coating free air to said containers for disturbing said film and for diluting the concentration of said coating compound in said film.

4. A coating hood according to claim 3; further characterized in that said fresh air supplying means includes at least one fresh air supplying slot defined in said side walls and arranged asymmetrically with respect to each other along a center line along which said containers pass in said space.

5. A coating hood for applying uniform protective coatings to glass containers, said coating hood comprising:
   (a) a pair of spaced side walls defining a space through which said containers pass from an entrance opening to an exit opening;
   (b) coating air supply means defined in at least one side wall for supplying process air comprised of a coating compound entrained in a gas, to said containers;
   (c) exhaust means defined in at least one side wall for receiving an output from said space; and
   (d) means for introducing the coating compound to said coating air supply means;
   characterized by:
   (e) exhaust hood means positioned above and outside of said coating hood adjacent said entrance and exit openings for exhausting said output that escapes from said coating hood.

6. A coating hood for applying uniform protective coatings to glass containers containing a main body and a finish, said coating hood comprising:
   (a) a pair of spaced side walls defining a space through which said containers pass from an entrance opening to an exit opening along a centerline, each said side wall having opposite end surfaces adjacent said entrance and exit openings, respectively;
   (b) coating air supply means defined in at least one side wall for supplying process air comprised of a coating compound entrained in a gas, to said containers;
   (c) finish air supply means positioned at a height above said coating air supply means for supplying coating free air across the finish of each said container as the latter are transported through said coating hood;
   (d) exhaust means defined in at least one side wall for receiving an output from said space, said exhaust means including at least one exhaust slot extending vertically in at least one of said side walls and suction means connected to an upper end of said at least one exhaust slot; and
   (e) means for introducing the coating compound to said coating air supply means;
   characterized by:
   (f) each said end surface being inclined with respect to said centerline so as to reduce the amount of stagnant ambient air at said entrance and exit openings and to thereby reduce the amount of said output that escapes through said entrance and exit openings;
   (g) each said exhaust slot being inclined at an angle away from a respective closest one of said entrance and exit openings to reduce the amount of said output that escapes through said entrance and exit openings, and the distance between said entrance and exit openings and the respective nearest exhaust slot being a multiple of the distance between said spaced side walls;
   (h) baffle means, having at least one opening and positioned in blocking relation to said at least one exhaust slot, for providing substantially equal exhaust in the vertical direction through said at least one exhaust slot;
   (i) exhaust hood means positioned above and outside of said coating hood adjacent said entrance and exit openings for exhausting said output that escapes from said coating hood;
   (j) means for disturbing a film of said coating compound surrounding said containers in said space and for diluting the concentration of said coating compound in said film;

(k) means for reducing the amount of said output contained in parcels between said containers from escaping from said coating hood with said containers; and (l) pressure adjustment means for maintaining pressures at opposite ends of said coating hood substantially equal.

* * * * *